(12) United States Patent
Illek et al.

(10) Patent No.: US 6,995,030 B2
(45) Date of Patent: Feb. 7, 2006

(54) SEMICONDUCTOR CHIP FOR OPTOELECTRONICS

(75) Inventors: Stefan Illek, Feldkirchen (DE); Klaus Streubel, Laaber (DE); Walter Wegletter, Nittendorf (DE); Andreas Ploessl, Regensburg (DE); Ralph Wirth, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/346,605

(22) Filed: Jan. 17, 2003

(65) Prior Publication Data

US 2003/0141496 A1 Jul. 31, 2003

Related U.S. Application Data

(62) Division of application No. 09/750,004, filed on Dec. 27, 2000, now abandoned.

(30) Foreign Application Priority Data

| Aug. 8, 2000 | (DE) | 100 38 671 |
| Nov. 30, 2000 | (DE) | 100 59 532 |

(51) Int. Cl.
 *H01L 21/00* (2006.01)

(52) U.S. Cl. .............. 438/29; 438/39; 438/42; 438/458

(58) Field of Classification Search ............ 438/25, 438/26, 29, 39, 42, 108, 455, 456, 458, 22; 257/94

See application file for complete search history.

(56) References Cited

U.S. PATENT DOCUMENTS

| 3,813,587 A | 5/1974 | Umeda et al. |
| 4,039,890 A | 8/1977 | Bailey et al. |
| 5,008,718 A | 4/1991 | Fletcher et al. |

(Continued)

FOREIGN PATENT DOCUMENTS

| DE | 1 589 099 | 3/1970 |
| DE | 27 16 205 | 11/1977 |
| DE | 199 11 717 | 9/2000 |

(Continued)

OTHER PUBLICATIONS

Japanese Abstract, Publication No. 06318731 A, Date of Publication Nov. 15, 1994 and English translation of Japanese patent.

Japanese Abstract, Publication No. 6–268252, Publication Date Sep. 22, 1994 and English translation of Japanese patent.

M.R. Krames, et al., "High–power truncated–inverted–pyramid $(Al_xGa_{1-x})_{0.5}In_{0.5}P$/GaP light–emitting diodes exhibiting >50% external quantum efficiency", Applied Physics Letter, vol. 75, No. 16, pp. 2365–2367, Oct. 1999.

R. Windisch et al., "High–efficiency non–resonant cavity light–emitting diodes", Electronics Letters, vol. 34, No. 11, pp. 1153–1154, May 28, 1998.

(Continued)

*Primary Examiner*—Tuan H. Nguyen
(74) *Attorney, Agent, or Firm*—Cohen, Pontani, Lieberman & Pavane

(57) ABSTRACT

An optoelectronic semiconductor chip has an active layer containing a photon-emitting zone. The active layer is attached to a carrier member at a bonding side of the active layer. The active layer has at least one recess therein with a cross-sectional area that decreases with increasing depth into said active layer proceeding from said bonding side.

16 Claims, 11 Drawing Sheets

U.S. PATENT DOCUMENTS

| | | | |
|---|---|---|---|
| 5,087,949 A | | 2/1992 | Haitz |
| 5,376,580 A | * | 12/1994 | Kish et al. .................. 438/26 |
| 5,491,350 A | | 2/1996 | Unno et al. |
| 6,091,085 A | | 7/2000 | Lester |
| 6,111,272 A | | 8/2000 | Heinen |
| 6,229,160 B1 | | 5/2001 | Krames et al. |
| 2002/0009238 A1 | | 1/2002 | Bird |

FOREIGN PATENT DOCUMENTS

| | | |
|---|---|---|
| EP | 0 022 486 A1 | 1/1981 |
| EP | 0 319 907 A2 | 6/1989 |
| EP | 0 544 512 A1 | 6/1993 |
| EP | 0 905 797 A2 | 3/1999 |
| GB | 1 553 783 | 10/1979 |
| GB | 2 326 023 A | 12/1998 |
| JP | 6-151955 | 5/1994 |
| WO | WO 01/41219 | 6/2001 |

OTHER PUBLICATIONS

W.N. Carr et al., "One–Watt GaAs $p$–$n$ Junction Infrared Source", Applied Physics Letters, vol. 3, No. 10, pp. 173–175, Nov. 15, 1963.

"Nova Flares LEDs", Internet web page, Jun. 7, 1999.

* cited by examiner

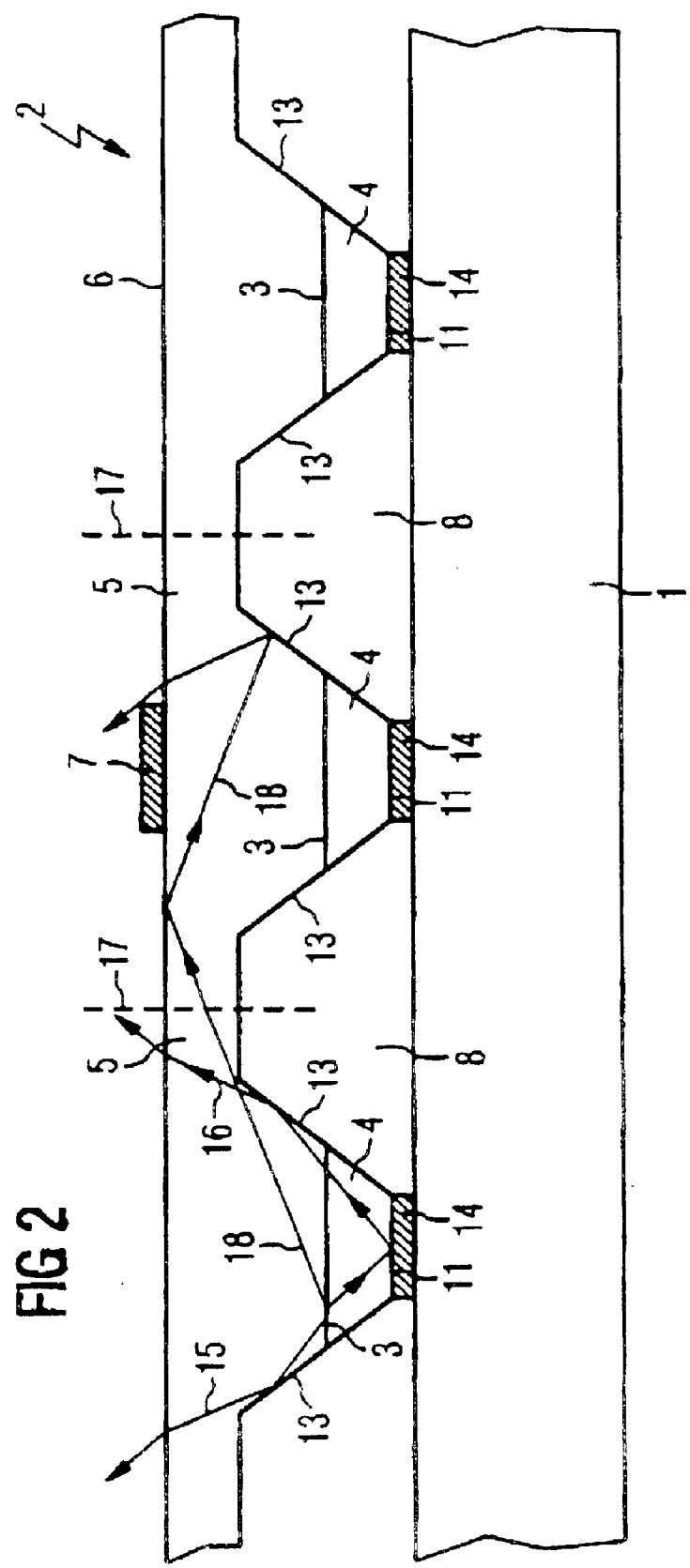

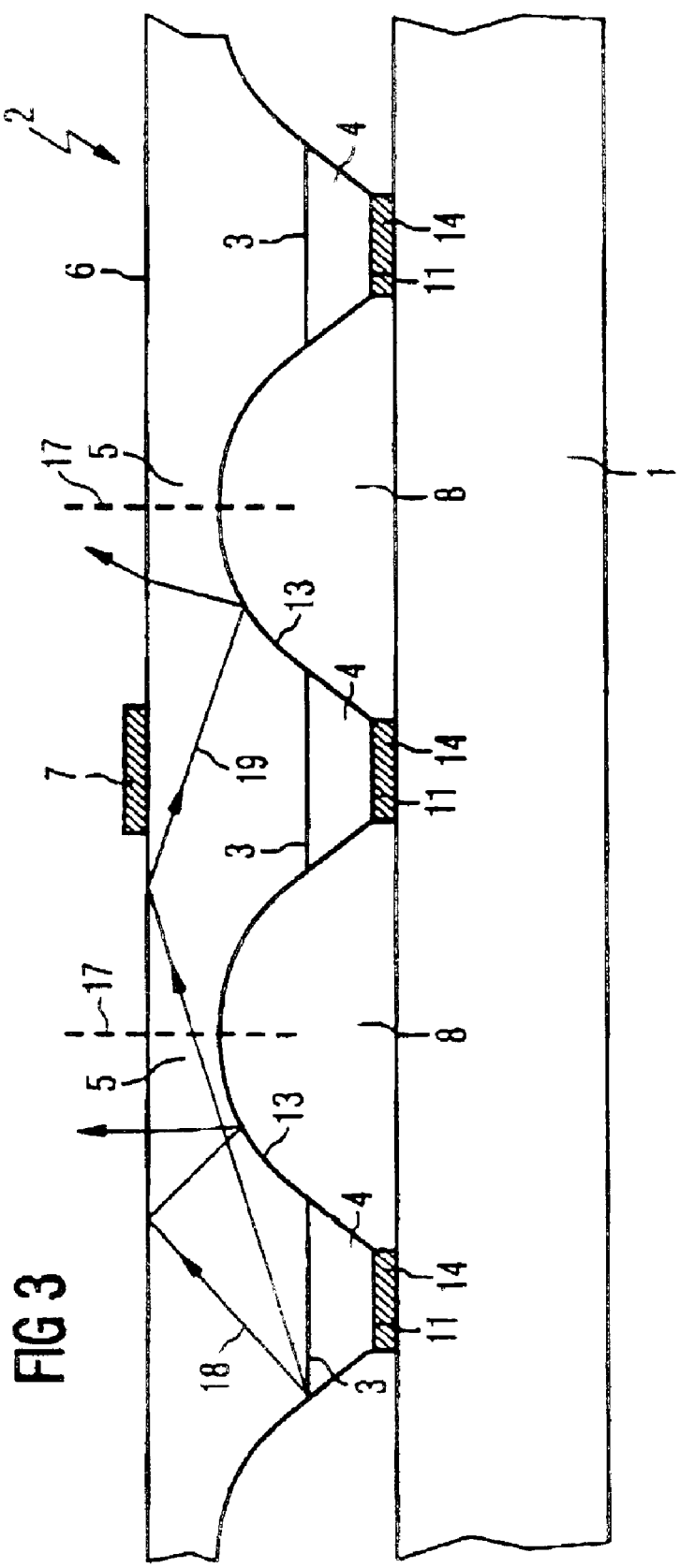

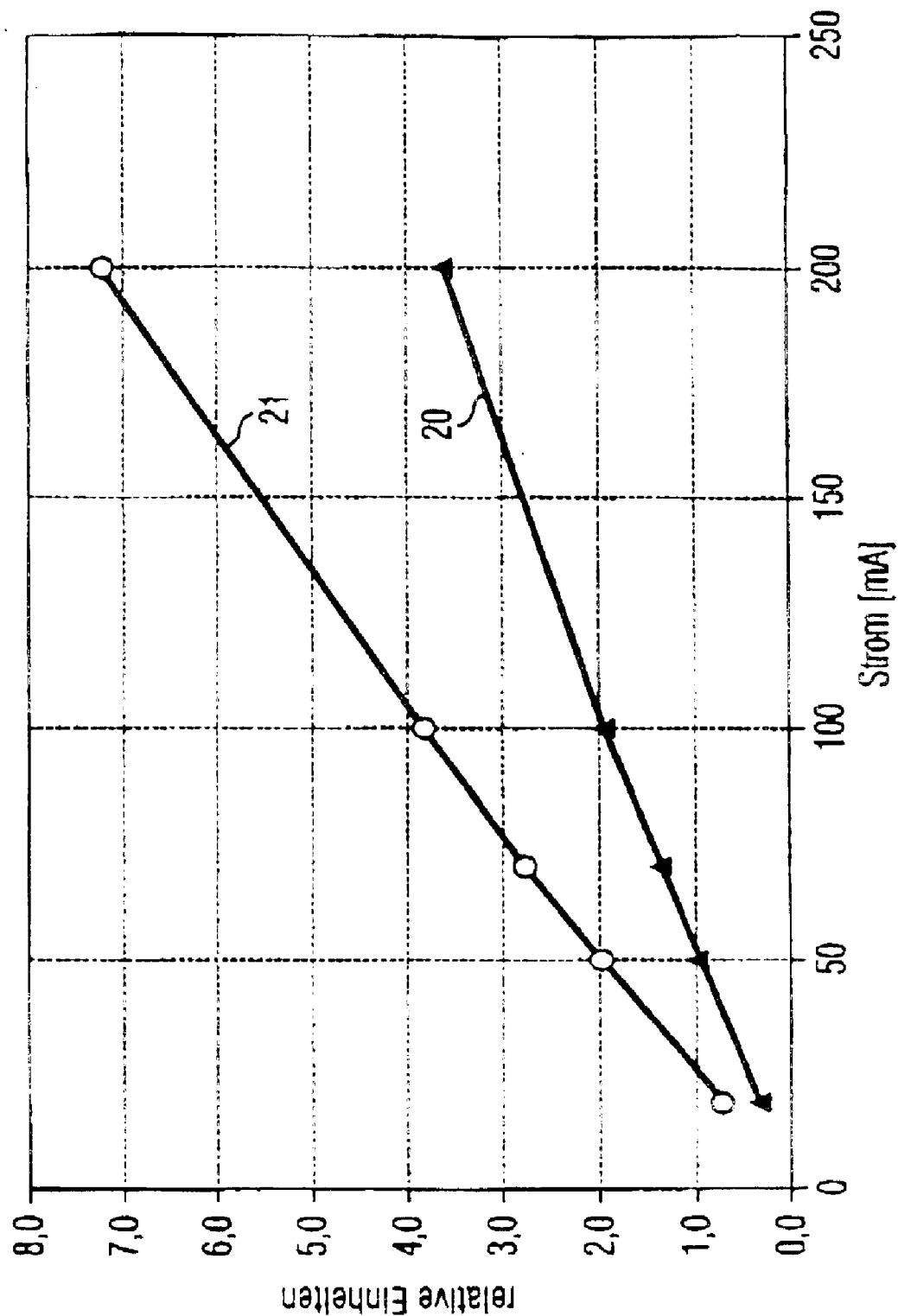

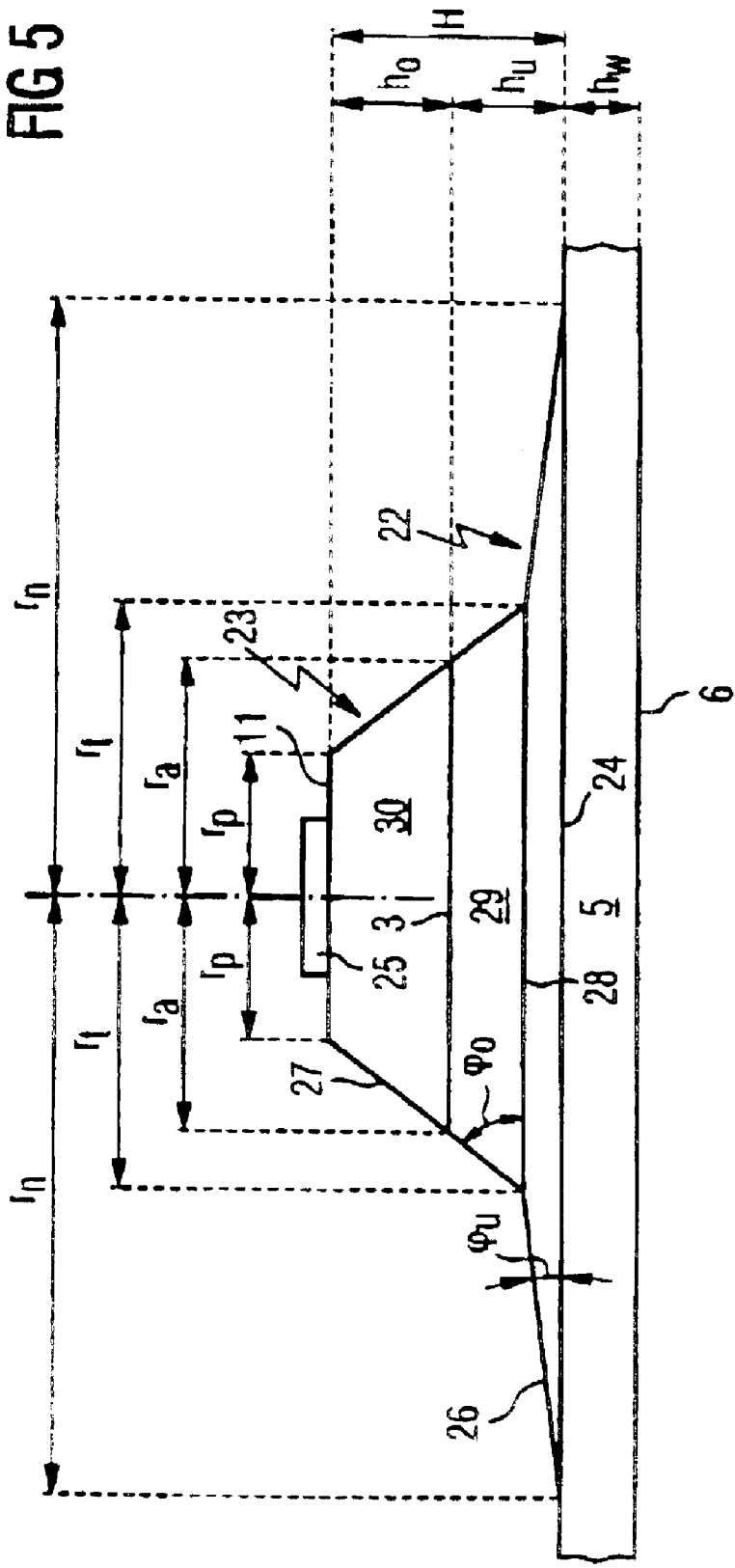

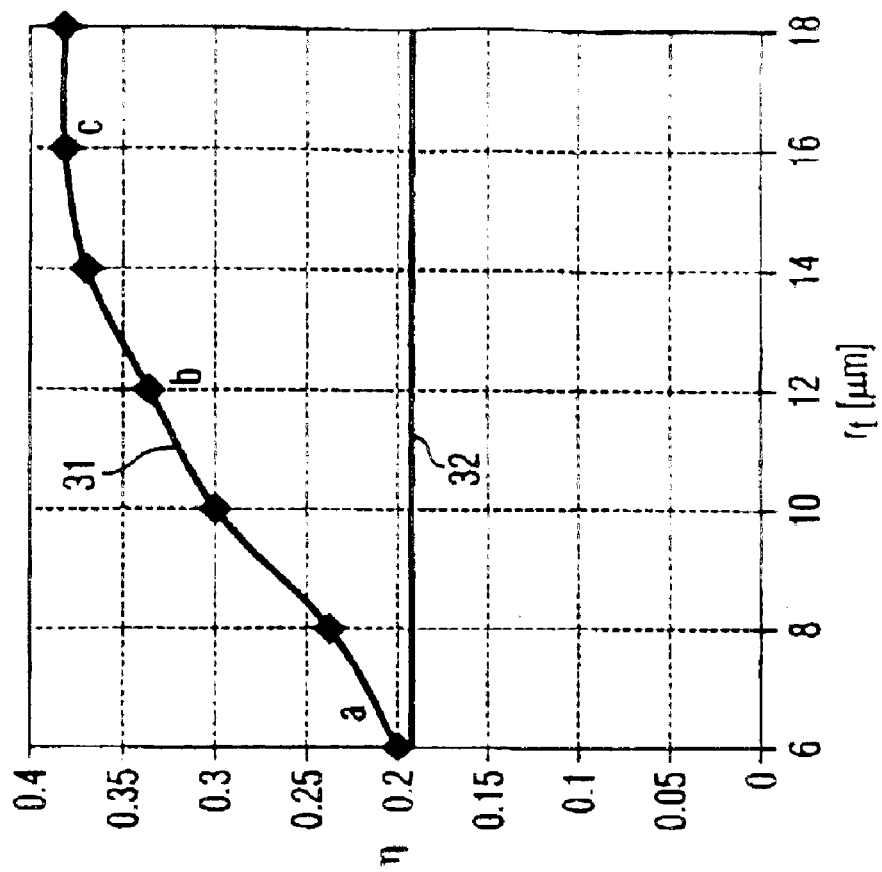
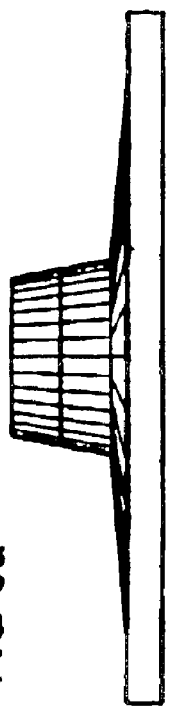
FIG 6a
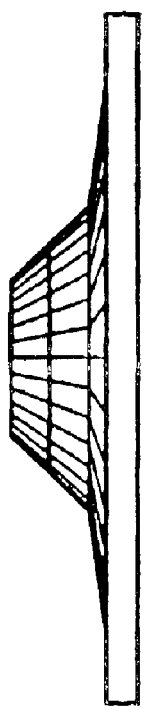
FIG 6b
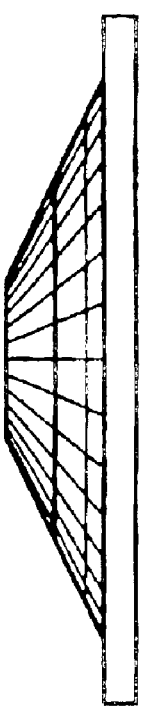
FIG 6c

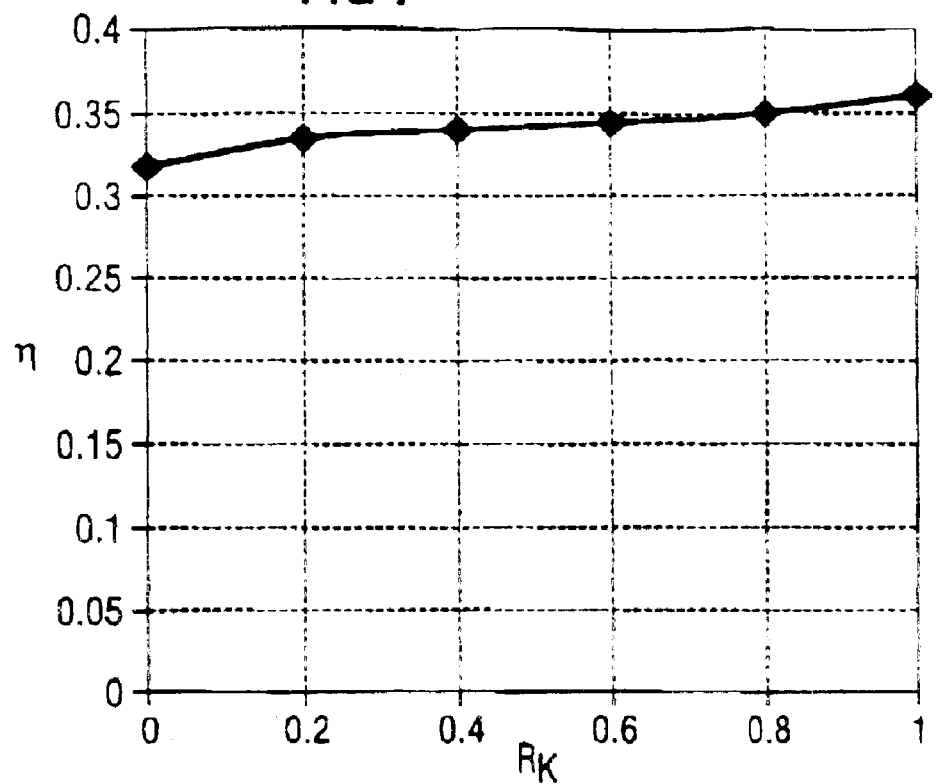
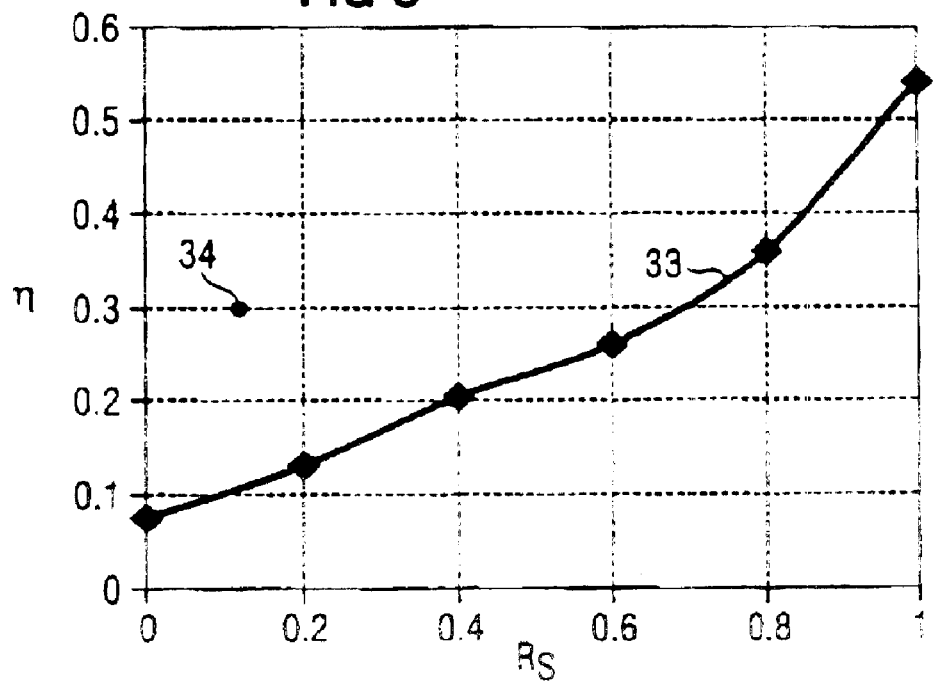

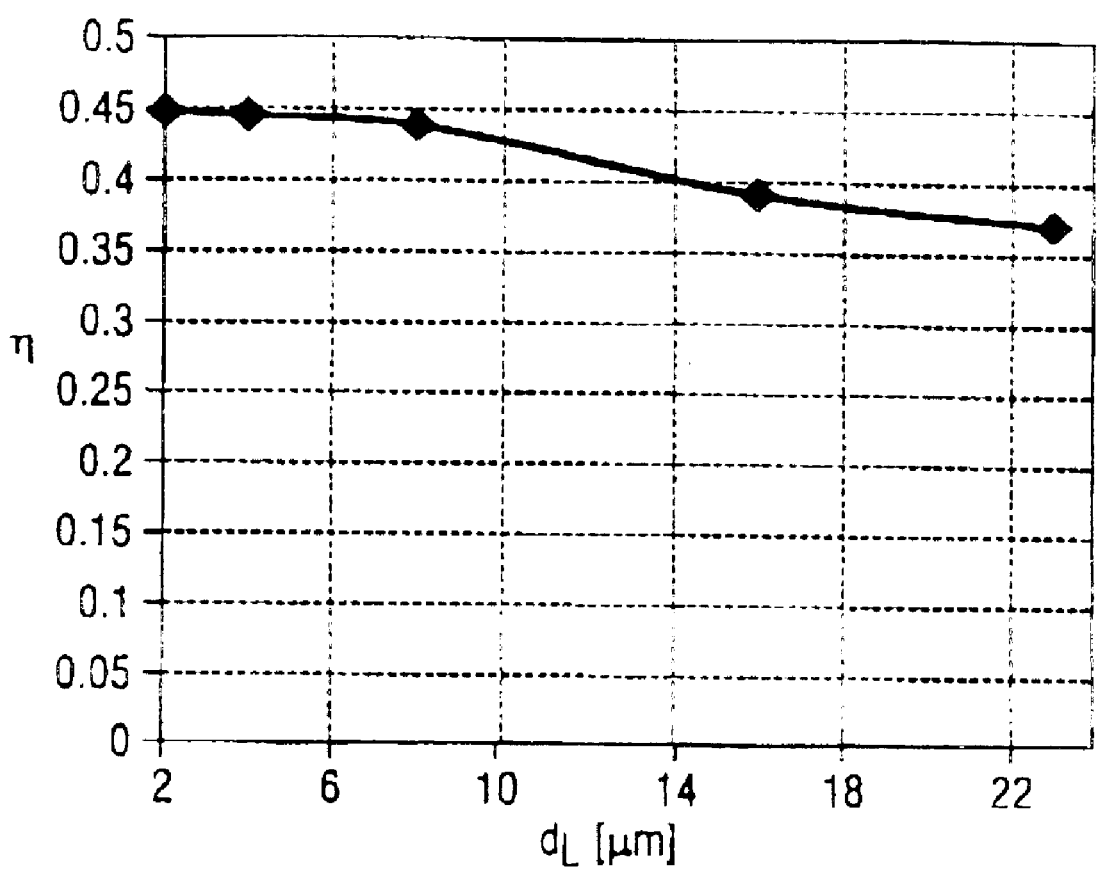

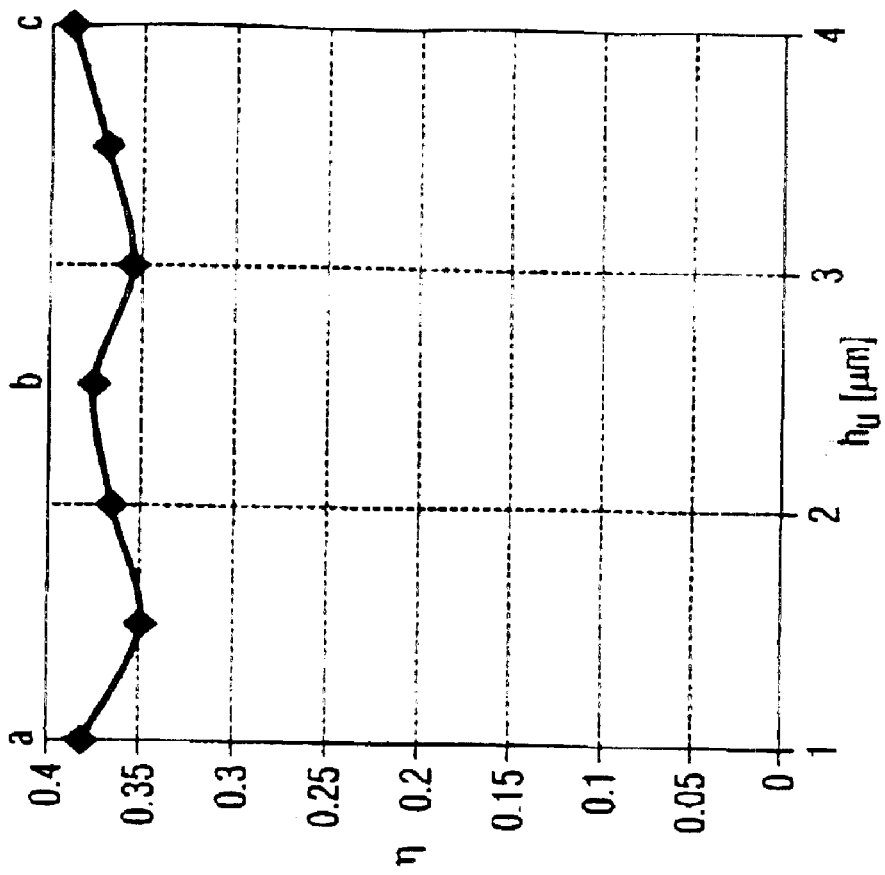
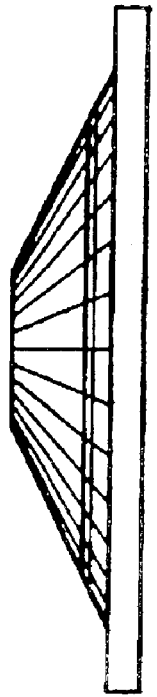
FIG 10a
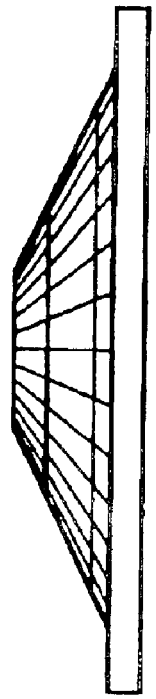
FIG 10b
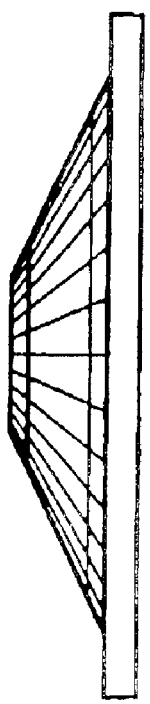
FIG 10c

SEMICONDUCTOR CHIP FOR OPTOELECTRONICS

CROSS REFERENCE TO RELATED APPLICATIONS

This is a division of application Ser. No. 09/750,004, filed Dec. 27, 2000 now abandoned.

BACKGROUND OF THE INVENTION

1. Field of the Invention

The present invention is directed to a semiconductor chip for optoelectronics of the type having an active layer with a photon-emitting zone and that is attached to a carrier member at a bonding side.

2. Description of the Prior Art

Semiconductor chips of the above type produced in thin-film technology are disclosed in European Application 0 905 797. For manufacturing the known semiconductor chip, an active layer is usually applied on a substrate with an epitaxial process. A carrier member is subsequently secured to the upper side of the active layer, and the substrate is removed. A metallic reflection layer is located between the carrier member and the active layer, so that no light is absorbed by the carrier member. The known semiconductor chips are particularly suitable for applications wherein a high optical power is required.

One disadvantage of the known semiconductor chips manufactured in thin film technology is that the metallic reflection layer arranged between the carrier member and the active layer generally does not exhibit a satisfactory reflectivity at short wavelengths. Particularly given a wavelength of less than 600 nm, gold becomes increasingly inefficient as the metallic reflection layer, since the reflectivity significantly decreases. At wavelengths below 600 nm, for example, the elements Al and Ag can be employed, their reflectivity remaining comparatively constant at wavelengths below 600 nm.

Moreover, large surfaces such as the metallic reflection layer are difficult to bond. As a result of the bonding and the alloying of the metallic contact layer, moreover, the quality of the metallic reflection layer is generally degraded.

German OS 198 07 758 discloses a truncated pyramid-shaped semiconductor chip that has an active, light-emitting zone between an upper window layer and a lower window layer. The upper window layer and the lower window layer together form a truncated pyramidal base member. The slanting alignment of the sidewalls of the window layers cause the light emanating from the active zone to be totally reflected at the side faces, so the reflected light is incident on the base area of the truncated pyramid-shaped base member, serving as luminous surface, substantially at a right angle. As a result, a part of the light emitted by the active zone emerges onto the surface within the exit cone of the semiconductor element. The term exit cone in this context means the cone of the light rays whose incident angle is smaller than the critical angle for the total reflection and that are therefore not totally reflected. In order to arrive at a significant enhancement of the light yield, this concept assumes a minimum thickness for the upper and lower window layer. In the known truncated pyramid-shaped semiconductor component, the thickness of the upper and lower window layer amounts to at least 50.8 $\mu$m (2 milli-inches). Such a thickness is still within a range allowing the layers to be produced without difficulty. If, however, the power of the known semiconductor chip is to be increased, it is necessary to scale all dimensions. Layer thicknesses thereby quickly derive that can be manufactured only given high outlay in an epitaxial layer. The known semiconductor chip is therefore not scalable without further difficulty.

SUMMARY OF THE INVENTION

Proceeding from this prior art, an object of the invention is to provide a semiconductor chip that is manufacturable in thin-film technology that has improved light output.

This object is inventively achieved in a semiconductor chip of the type initially described wherein a recess is introduced into the active layer proceeding from the bonding side, the cross-sectional area of this recess decreasing with increasing depth.

As a result of recess, the bonding side of the semiconductor chip can be made significantly smaller, so that the bonding of the active layer on the carrier member can be unproblemmatically implemented. As a result of the recess, moreover, lateral faces are created at which a part of the photons emitted by the active layer is reflected such that the photons within the exit cone strike the exist face of the active layer lying opposite the bonding surface. In the semiconductor chip of the invention, so to speak, the reflection at the continuous reflection layer is replaced by the reflection at the lateral faces of the recesses.

In one embodiment of the invention, the recesses are so deep that the active zone of the active layer is interrupted by the recess introduced into the active layer proceeding from the bonding side.

It has been shown that semiconductor chips whose active zone is interrupted by a recess introduced into the active layer proceeding from the bonding side exhibit an especially high light yield. In this case, it is not only the photons emitted toward the bonding side but also the photons emitted toward the exit face of the active layer, that are caused to proceed at a large angle relative to the exit face by the reflection at the lateral faces of the recess.

In a preferred embodiment of the invention, elevations on a connecting layer of the active layer are formed by the recesses.

Such elevations act as collimators that align the trajectories of the photons emitted by the active zone nearly at a right angle relative to the exit face of the semiconductor chip. As a result, a majority of the emitted photons within the exit cone strikes the exit face and can exit the semiconductor chip.

In another preferred embodiment, the connecting layer is fashioned such that at least one trajectory of the photons emitted by the active zone proceeds from the respective elevation to one of the neighboring elevations.

Due to the optical coupling of the elevations, photons that have not been reflected at one of the lateral faces of the original elevation proceed into one of the neighboring elevations and are reflected such that at the lateral faces of the respective elevation so that they strike the exit face within the exit cone.

In a further embodiment of the invention, the elevations are provided with concave lateral faces.

As a result of these measures, photons that are initially reflected at the exit face are increasingly intensified with every further reflection at the lateral face of the elevations, so that they ultimately strike the exit face within the exit cone.

In another preferred embodiment, the elevations are covered with a reflective layer.

As a result of this measure, all light rays incident on the lateral face of the elevations are deflected in the direction toward the exit side of the semiconductor chip.

DESCRIPTION OF THE DRAWINGS

FIG. 2 is a cross-section through another exemplary embodiment of a semiconductor chip of the invention, wherein the active zone is arranged within truncated pyramid-shaped elevation.

FIG. 3 is a cross-section through a semiconductor chip of the invention that is provided with elevations that have concave lateral faces.

FIG. 4 is a diagram that shows the intensification of the light yield in a semiconductor chip of the invention, compared to a conventional semiconductor chips.

FIG. 5 is a cross-sectional profile of an elevation in the inventive semiconductor chip that is composed of a lower, flat frustum and an upper, steep frustum.

FIGS. 6a through 6d respectively show cross-sectional profiles of elevations in the inventive semiconductor chip, and a diagram that shows the dependency of the output efficiency on the radius of the boundary surface between the lower truncated pyramid and the upper truncated pyramid of the elevation of FIG. 5.

FIG. 7 is a diagram that shows the dependency of the output efficiency on the reflectivity of a contact layer arranged on the tip of the elevation of FIG. 5.

FIG. 8 is a diagram that shows the dependency of the output efficiency on the reflectivity of the lateral faces of the elevation of FIG. 5.

FIG. 9 is a diagram from which the relationship between output efficiency and size of a luminous spot in the active zone proceeds.

FIGS. 10a through 10d respectively show cross-sectional profiles of an elevation in the inventive semiconductor chip, wherein the height of the active zone is varied, and a diagram that shows the output efficiency dependent on the thickness of a lower limiting layer.

DESCRIPTION OF THE PREFERRED EMBODIMENTS

Figure 1:
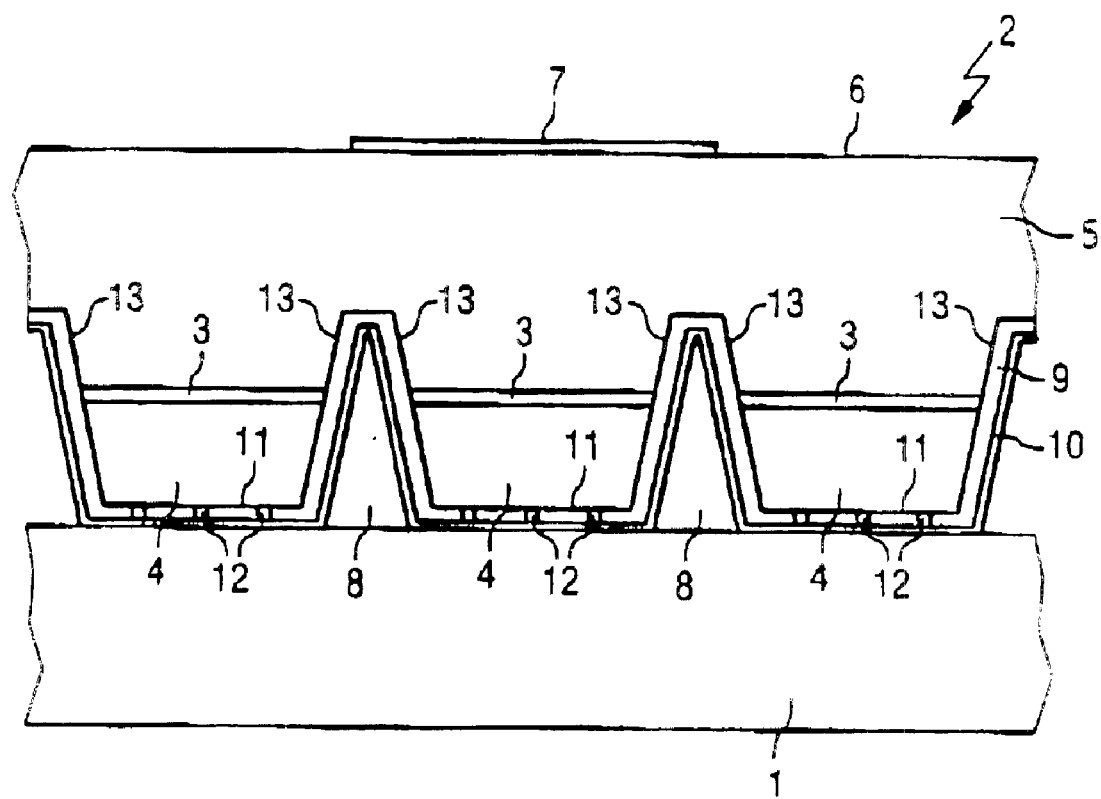
FIG. 1 is a cross-section through an exemplary embodiment of a semiconductor chip of the invention.

The semiconductor chip shown in FIG. 1 for a light-emitting diode has a carrier member 1 on which an active layer 2 is attached. For clarity, the thickness of the active layer 2 is shown exaggerated in relationship to the thickness of the carrier member 1. The active layer 2 has a photon-emitting, active zone 3 that is fashioned with elevations 4 at a mid-height. The elevations 4 can be fashioned as a truncated pyramid or truncated cone.

The elevations 4 are arranged on a connecting layer 5 that has a central contact location 7 of the front side on a flat front side 6, the contact location 7 being formed by a metallization layer. The elevations 4 of the backside formed by recesses 8 are covered with a reflective layer that is composed of a dielectric insulating layer 9 and a metallization layer 10 applied thereon. The insulating layer 9 is interrupted by through-contacts 12 along a base area 11 of the elevations 4, the through-contacts 12 being formed by metallic sections.

For manufacturing the semiconductor chip shown in FIG. 1, the active layer 2 is first epitaxially grown on a base substrate. The active layer 2 can, for example, be manufacture on the basis of InGaAlP. The connecting layer 5 is thereby produced first on the base substrate and, subsequently, is doped with a concentration above $10^{16}\,cm^{-3}$ in order to assure a good conductivity of the connecting layer 5. Good conductivity of the connecting layer 5 is a pre-condition one central contact location 7 on the front side 6 being sufficient for supplying the active zone 3 with current. Moreover, the composition of the connecting layer 5 is selected such that it is transparent for the photons generated in the active zone 3. This can usually be accomplished via setting the band gap on the basis of the composition of the material of the connecting layer 5.

Subsequently, a further layer is applied on the connecting layer 5, the elevations 4 being introduced into this layer by suitable wet-chemical or dry-chemical etching processes. Such etching processes are known and are not the subject matter of the present application. The elevations 4 are preferably formed in the regions provided for the semiconductor chips. These are regions having typical outside dimensions of 400×400 $\mu m^2$. The elevations 4 have outside dimensions that lie in the range of the layer thickness of the active layer 2. The outside dimensions of the elevations 4 therefore are in the range of 10 $\mu m$.

The deposition of the insulating layer 9 onto the elevations 4 and the formation of the through-contacts 12 ensue in a further method step. Subsequently, the metallization layer 1 is applied.

Subsequently, the active layer 3 is divided (separated) according to the intended number of semiconductor chips. This ensues, for example, by wet etching.

The separated active layers at the carrier member 1 are then secured, for example by eutectic bonding, and the base substrate is removed by wet-etching. Finally, the contact locations 7 are formed at the exposed front side of the active layer 2, and the semiconductor chips are separated by dividing the carrier member 1.

The semiconductor chip shown in FIG. 1 exhibits the advantage that the photons generated by the active zone 3 do not strike components of the semiconductor chip that would absorb them. The photons are kept away from the carrier member 1 by the metallization layer 10.

Another advantage of the semiconductor chip of FIG. 1, is that a majority of the photons emitted from the active zone 3 are totally reflected at lateral faces 13 of the elevations 4. The photons totally reflected at the lateral faces 13 strike the front side 6 at a large angle. In particular, a part of the photons that would be totally reflected at the front side without reflection at the lateral faces 13 strikes the front side 6 within the exit cone, and can therefore exit the semiconductor chip. In the semiconductor chip according to FIG. 1, therefore, the reflection at the continuous base area known from the prior art is at least partially replaced by the total reflection at the lateral faces 13. The semiconductor chip of FIG. 1 compared to conventional semiconductor chips without recesses 8 therefore exhibits a light yield enhanced by nearly a factor of two.

The described effect is explained in detail below with reference to the further exemplary embodiments shown in FIGS. 2 and 3.

A number of light rays are considered in the following discussion, but the term light rays is not a limitation to a specific wavelength, but refers to the processes of geometrical optics, regardless of the wavelength.

In the exemplary embodiments shown in FIG. 2, the elevations 4 are fashioned as a truncated pyramid and are secured to the carrier member 1 via a contact layer 14 only at the base area 11 of the elevations 4. The active zone 3 is supplied with current by the contact layer 14.

Due to the large difference between the refraction indices of semiconductor material compared to casting resin of, typically, 3.5 to 1.5, only light rays that strike the boundary surface within an exit cone having an aperture angle of approximately 16° can be coupled out from the semiconductor at the boundary surface between the semiconductor and the casting resin. Given a uniform distribution of the angles of incidence of the light rays, this corresponds to approximately 2% of the light rays that are incident on a surface unit.

Due to the elevations 4, the light rays emanating from the active layer 2 are steered in the direction onto the front side 6. The elevations 4 therefore act as collimators in whose respective focal surfaces the active zone 3 is located. The elevations 4 causes the light rays that are incident on the lateral faces 13 to be intensified in the direction toward the front side 6 so that they strike within the exit cone, so that they can exit the semiconductor chip. The light yield thereby can be optimized on the basis of a suitable selection of the dimensions of the base area 11, the angle of inclination of the lateral face 13, and of the height of the elevations 4, as well as the position of the active zone 3.

FIG. 2 shows a light ray 15 that is initially totally reflected at the lateral face 13 and is steered therefrom to the front side 6. At the front side 6, the light beam 15 strikes the boundary surface within the exit cone and therefore can exit the semiconductor chip. Without the total reflection at the lateral face 13, the light wave 15 would be totally reflected at the front side 6 and would have been deflected back to one of the reflection layers known from the prior art where it would have been reflected again. In this respect, the reflection at the conventional, continuous reflection layer is replaced by the reflection at the lateral faces 13 given the exemplary embodiment shown in FIG. 2.

This is also true for a light ray 16 that is initially reflected at the base area 11 and then at the lateral face 13. The light ray 16 as well is deflected to the front side 6 after the second reflection, where it strikes within the exit cone. Without the reflection at the lateral face 13, the light ray 16 would likewise be totally reflected at the front side 6 and would have been steered back to a back-side reflection layer.

It is also advantageous that the elevations 4 are optically coupled via the connecting layer 5. Optical coupling in this context means that at least one of the light rays emanating from the active layer 2 can proceed across a center line 17 from the regions of one of the elevations 4 into the regions of one of the neighboring elevations 4. Due to the optical coupling with the assistance of the connecting layer 5, a light ray 18 that does not strike one of the lateral faces 13 of the respective elevations 4 can strike one of the lateral faces 13 of one of the neighboring elevations 4 and be deflected to the front side 6 where it is incident within the exit cone. Due to the optical coupling via the connecting layer 5, the light yield therefore is enhanced further.

FIG. 3 shows a cross-section through a modified exemplary embodiment of the semiconductor chip wherein the elevations 4 are fashioned as a concave cone with concave lateral faces 13. The fashioning of the lateral faces 13 causes a light ray 18 to be reflected back and forth between the front side 6 and the lateral face 13 and thus it is increasingly intensified as it approaches the center line 27, until it strikes the front side 6 within the exit cone. The same is true of light rays 9 that initially proceed via the connecting layer 5 from one elevation 4 to the neighboring elevation 4 and thus are directed at a large angle to the front side 6.

FIG. 4 is a diagram wherein a measured curve 20 shows the dependency of the light yield in relative units on the operating current given pulsed mode for a conventional light-emitting diode manufactured in thin-film technology. A further measured curve 21 illustrates the dependency of the light yield in relative units dependent on the operating current for a light-emitting diode according to the exemplary embodiment shown in FIG. 3. It can be seen from FIG. 4 that the light yield given the exemplary embodiments shown in FIG. 3 exhibits approximately twice the light yield of conventional semiconductor chips without recesses 8.

In order to determine the most beneficial shape for the elevations 4, a number of ray tracing simulations were implemented. The results of these calculations are presented in detail below with reference to FIGS. 5 through 14.

First, the parameters varied in the calculations shall be explained with reference to FIG. 5. FIG. 5 shows a cross-sectional profile of one of the elevations 4. In the illustrated case, the elevation 4 is composed of a lower truncated cone 22 and of an upper truncated cone 23. The lower truncated cone 22 has a base area 24 adjoining the connecting layer 5. The active zone 3 is formed in the upper truncated cone 23. Moreover, a contact location 25 arranged on the base area 11 of the elevation 3 is provided in FIG. 5.

The lateral faces 13 of the elevation 4 are composed of a sidewall 26 of the lower truncated cone 22 and sidewalls 27 of the upper truncated cone 23. The geometrical dimensions of the lower truncated cone 22 along a shared boundary surface 28 are selected such that the sidewall 26 merges directly into the sidewall 27.

Various dimensions of the elevation 4 are referred to below as follows. The radius of the base area 24 of the lower truncated cone 22 is referenced $r_n$, the radius of the boundary surface 28 is referenced $r_t$, and the radius of the base area 11 is referenced $r_p$. Further, the elevation 4 can be divided into a lower limiting layer 29 between the base area 24 and the active zone 3 and an upper limiting layer 30 between the active zone 3 and the base area 11. The lower limiting layer 29 has a height $h_u$, and the upper limiting layer 30 has a height $h_o$. The overall height of the elevation 4 is referenced H. This was consistently equated to 6 μm in all calculations. A value of 2 μm was selected for the thickness $h_w$ of the connecting layer 5 in all calculations and the thickness $h_w$ was not varied.

FIGS. 6a through 6d show the result of a calculation wherein the radius $r_p$ of the base area 11 was set equal to 5 μm, and the radius $r_n$ of the base area 24 was set equal to 20 μm. The radius $r_t$ of the boundary surface 28 was varied between 6 and 18 μm according to the cross-sectional profiles shown in FIG. 6a through FIG. 6c.

In the calculations, a refractive index of 3.2 was set for the active zone 3. The refractive index of the lower limiting layer 29, of the upper limiting layer 30 as well as of the connecting layer 5 was 3.3. Insofar as it was not varied, the reflectivity of the contact location 25 was set as 0.3. The reflectivity of the base area 11 not covered by the contact location 25, as well as the reflectivity of the sidewalls 26 and 27, was set to 0.8. As used herein, reflectivity means the reflection coefficient with respect to energy.

Further, the self-absorption of the active zone 3 was taken into consideration with an absorption coefficient of 10,000/cm. All calculations were implemented with photon recycling. An internal quantum efficiency of 0.8 was assumed for this. The quantum efficiency in the generation of photons by charge carrier recombination was not taken into consideration. The output efficiency η indicated in the diagrams is therefore equal to the ratio of the number of photons coupled out from the semiconductor chip to the number of photons actually generated. The values for the indicated output efficiency η therefore would also have to be multiplied by the factor 0.8 in order to arrive at the external efficiency.

It was also assumed that the reflection at the contact location 25 and the sidewalls 26 and 27 is angularly independent. The fact that the dielectric insulating layer 9 is first applied onto the elevations 4 and is supplemented by the reflective metallization layer 10 is therefore underestimated in effect in the calculations, since the total reflection occurring in this case is not taken into consideration in the calculations.

FIG. 6c shows a diagram wherein the output efficiency η is entered relative to the radius $r_t$ in a curve 31. For comparison, the output efficiency of a normal thin-film semiconductor chip is also entered, whereby the scatter is conveyed only via the photon recycling, This thin-film semiconductor having the edge length of 300 μm exhibits the same epitaxial structure as the elevation 4 in the lower truncated cone 22 and upper truncated cone 23. It was assumed that the semiconductor chip is provided with a mirror at the p-side, the reflectivity of said mirror amounting to 0.72. This value is the average value—weighted with the degree of occupancy—of the reflectivity of a reflection layer and of a contact layer, whereby the value 0.8 is set for the reflectivity of the reflection layer and the value 0.85 is set for the occupancy of the reflection layer, and the value 0.3 for the reflectivity of the contact layer and 0.15 for the occupancy were employed.

It can be seen from FIG. 6 that, given a very large pitch angle $\phi_o$ of the upper truncated cone 23 according to the cross-sectional profile shown in FIG. 6a, the output efficiency η is hardly any better than the output efficiency η of a traditional thin-film light-emitting diode whose output efficiency is shown in FIG. 6d by the straight line 32. This is also easily understood since the elevation 4 having the flat cross-sectional area profile shown in FIG. 6a hardly brings the light rays emanating from the active zone 3 into a steep angle relative to the light-emitting face 6. It is precisely this result, however, that the elevation 4 accomplishes with the cross-section profile shown in FIG. 6c, for which reason the output efficiency $h_n$ in this case amounts to nearly double the output efficiency η of a conventional thin-film light-emitting diode.

Further, the dependency of the output efficiency η on the reflectivity of the contact location 25 was investigated. To this end, the output efficiency η was calculated dependent on the reflectivity of the contact location 25, whereby the cross-sectional profile of the elevation 4 was same as the cross-sectional profile shown in FIG. 6b. It was also assumed that the contact location 25 covers the entire base area 11. It can be seen from FIG. 7 that the output efficiency η is not significantly dependent on the reflectivity of the contact location 25. The semiconductor chips described herewith elevations 4 at the fastening side therefore seems significantly less sensitive to the poor reflectivity of the contact locations 25 than are the traditional thin-film light-emitting diodes, since only a tiny fraction of the multiplex reflections leading to the output apparently occur between the base area 11 and the light-emitting area 12 but ensue three-dimensional in the elevation 4.

The relative independence from the reflectivity of the contact relation 25 is particularly advantageous since, in practice, a low ohmic resistance between the contact location 25 and the upper limiting layer 30 is generally linked to a poor reflectivity. A good ohmic contact, namely, requires the diffusion of atoms from the layer forming the contact location 25 into the material lying therebelow.

In contrast to the dependency on the reflectivity of the contact location 25, the dependency of the output efficiency η on the reflectivity $R_S$ of the reflective surfaces on the base area 11 and on the sidewalls 26 and 27 is very pronounced. This is shown by the results of a calculation that was implemented with a model for the semiconductor chip whose elevations 4 have the radii $r_p$=5 μm, $r_d$=16 μm and $r_n$=20 μm.

The elevations 4 therefore have approximately the cross-sectional profile shown in FIG. 6b.

The result of this calculation is a curve 33 entered in FIG. 8 that rises monotonously with increasing reflectivity $R_S$. A point 34 entered into the diagram from FIG. 8 represents the result of a calculation for a semiconductor chip on which no reflective layer was applied but that was embedded in resin as surrounding medium. However, total reflection occurs here, so that a greater output efficiency occurs compared to a semiconductor chip with a reflective layer. This would also be the case for the exemplary embodiment shown in FIG. 1 wherein the electrical insulating layer at which total reflection can likewise occur is arranged between the metallization layer 16.

FIG. 9 contains the result of a calculation that was carried out at a semiconductor chip with elevations 4 for whose radii the following was valid: $r_p$=5 μm $r_d$=16 μm and $r_n$=20 μm. The elevations 4 therefore essentially have the cross-sectional profile shown in FIG. 6a. The active zone 3 was thereby located at medium height between the base area 24 and the base area 11. In this calculation, the region wherein photons arise in the active zone 3 is constricted to a luminous spot whose diameter $d_s$ is entered on the abscissa. It can be seen on the basis of the diagram in FIG. 9 that the output efficiency is especially high given a small luminous spot. This means that photons in the center of the active zone 3 are coupled out especially well. In this respect, a slight Weierstrass effect is present.

Further, the influence of the position of the active layer 3 was investigated. Various cross-section profiles are shown in FIGS. 10a through 10c wherein the thickness $h_u$ of the lower limiting layer 29 and the thickness $h_u$ of the upper limiting layer 30 were varied such that the overall height H of the elevation remained constant. The result of this calculation is shown in FIG. 10d wherein the output efficiency 72 is entered dependent on the thickness $h_u$ of the lower limiting layer 29. This shows that the output efficiency η is only slightly dependent on the position of the active zone 3. An active zone 3 that lies in the lower half of the elevation 4 is to be preferred since the current density through the active zone 3 is then low and, therefore, the current load on the active zone 3 can be kept small, this avoiding aging and linearity problems.

Figure 11:
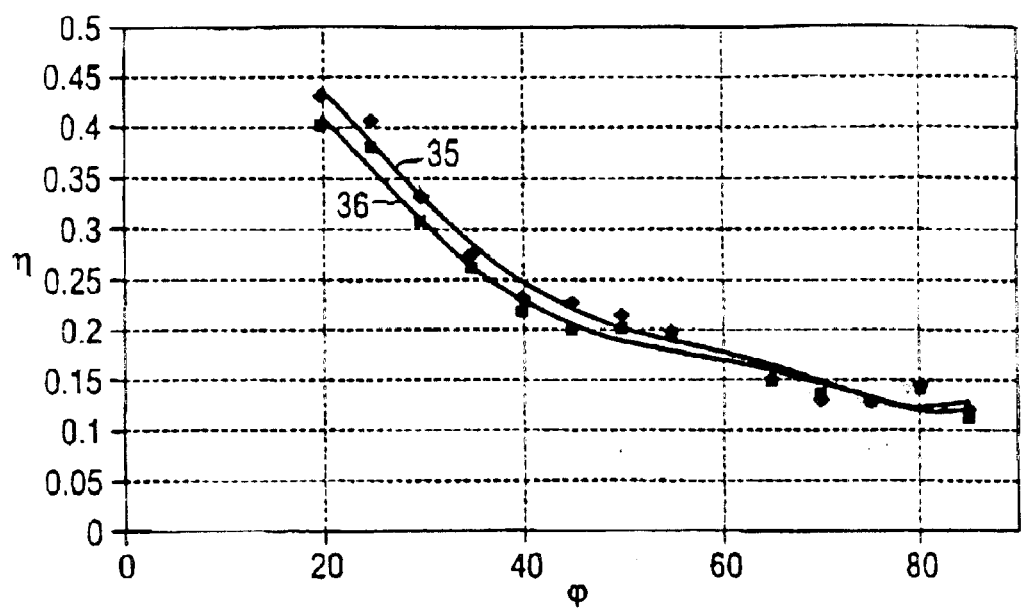
FIG. 11 is a diagram that shows the dependency of the output efficiency on the sidewall angle of the lateral faces of an elevation with the cross-sectional profile shown in FIG. 10b.
Figure 12:
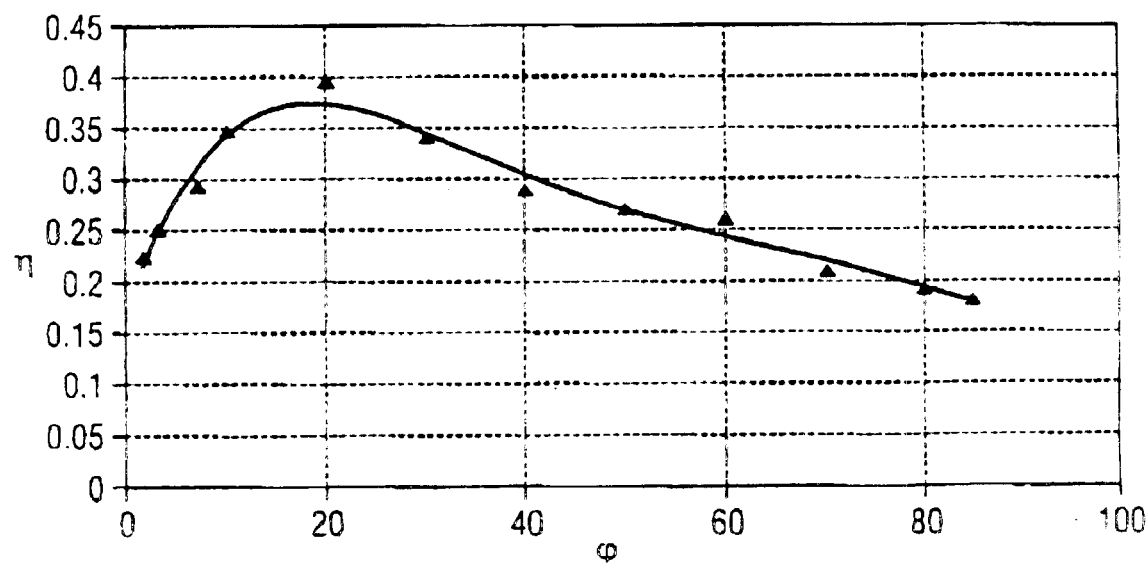
FIG. 12 is another diagram that shows the dependency of the output efficiency on the sidewall angle of an elevation having the cross-section profile from FIG. 10b.

Further, the influence of the set angle $\phi_o$ of the sidewall 27 and of the set angle $\phi_0$ of the sidewall 26 was investigated. A cross-sectional profile was assumed wherein the lower truncated cone 22 and the upper truncated 23 and exhibit the same value for the set angle $\phi_u$ and $\phi_0$. The radius $\phi_0$ of the active zone 3 was therefore kept constant at 10 μm and the set angle $\phi=\phi_0=\phi_u$ was varied. Two instances were considered. First, the output efficiency η was calculated for the periodic case wherein infinitely many elevations are arranged in a quadratic grid, whereby the distance of the foot point amounted to 10 μm. The result is reflected in the curve 35 in the diagram in FIG. 11. Moreover, an aperiodic case was investigated. To that end, the output efficiency η of a semiconductor chip was calculated with a single elevation 4, whereby all photons entering into the connecting layer 5 are absorbed by the connecting layer 5. The aperiodic case is shown in FIG. 11 by the curve 36. It can be seen from FIG. 11 that the connecting layer 5 supplies a noticeable contribution to the output efficiency η.

There is also an optimum range for the sidewall angle φ. This can be seen with reference to FIG. 12. In the underlying calculation, the radius $r_p$ was set equal to 10 μm. The radius $r_a$ of the active zone 3 and the radius $r_n$ of the base area 24 were varied such that the set angle φ of the sidewalls 27 and 26 covers the value range between 1.5° and 85°. As can be seen from FIG. 12, an optimum angular range exists for the set angle φ. The sidewall angle φ should lie between 5° and 60°, preferably between 10° and 40°. Especially good values for the output efficiency η arise when the set angle φ lies between 15° and 30°.

Figure 13:
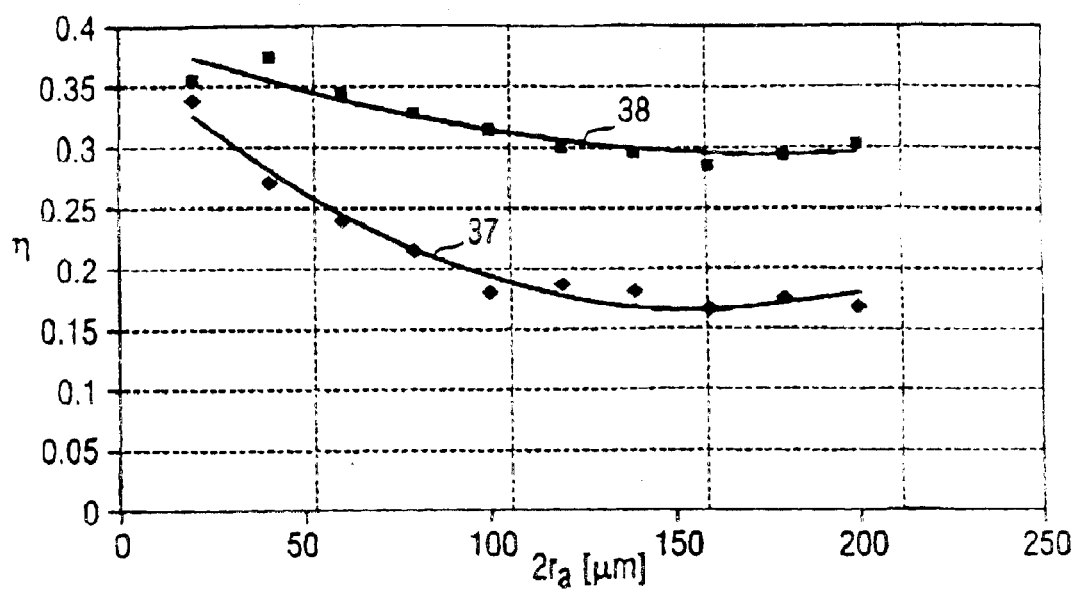
FIG. 13 is a diagram that shows the dependency of the output efficiency on the width of the active layer given constant height.

An investigation was subsequently carried out to determine the effect of varying the width of the elevations 4 on the output efficiency η. In this case, the height H of the elevations 4 was kept constant, and the radii $r_p$, $r_a$ and $r_n$ were uniformly increased. A curve 37 in FIG. 13 illustrates the case where the reflectivity $R_K$ of the contact location 25 is equal to 0.3. Another curve 38 is directed to the case where the reflectivity $R_K$ of the contact location 25 amounts to 0.8. The curve 37 as well as the curve 38 show the dependency of the output efficiency η on the diameter 2 $r_a$ of the active zone 3. Given good reflectivity of the contact location 25, the output efficiency η drops only slightly with increasing diameter of the active zone 3. The curve 37, that illustrates the realistic case of a poor reflectivity $R_K$ of the contact location 25, however, shows that the output efficiency η decreases significantly with increasing diameter of the active zone 3. The output efficiency therefore becomes better as the lateral expanse of the elevations 4 is made smaller.

Figure 14:
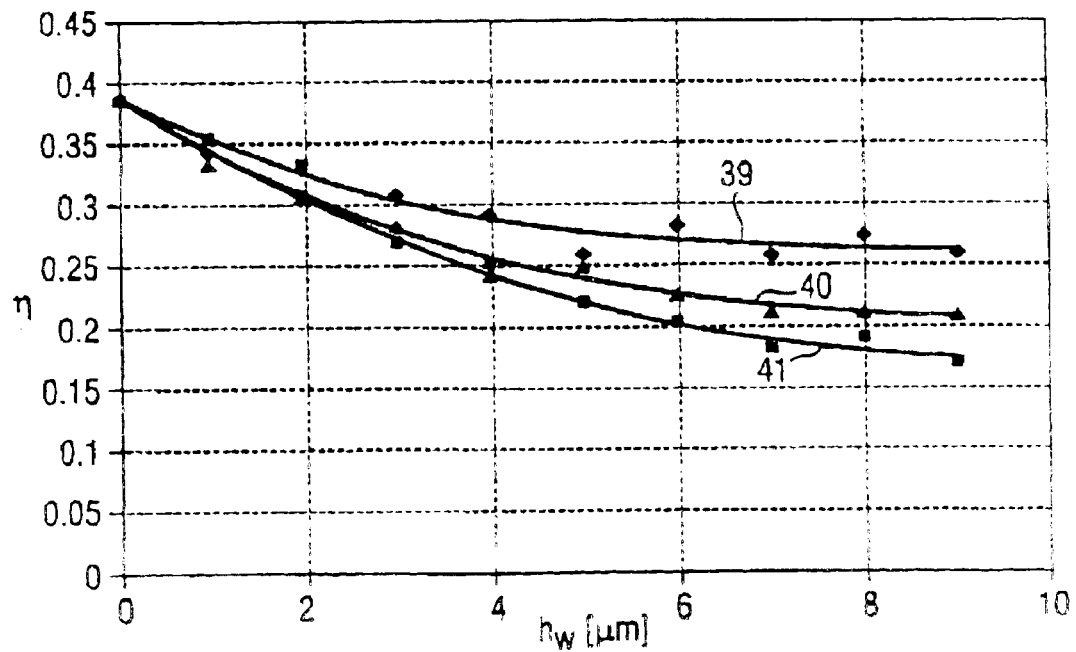
FIG. 14 is a diagram that shows the dependency of the output efficiency on the thickness of a connecting layer uniting elevations with various profiles in the inventive semiconductor chip.

The thickness of the connecting layer 5 is also of significance for the output efficiency η. FIG. 14 shows the output efficiency η for various cases dependent on the thickness $h_w$ of the connecting layer 5. A curve 39 reflects the aforementioned periodic drop. A further curve 40 is directed to the aperiodic case, and a third curve 41 is directed to a case wherein square semiconductor chips having an edge length of 300 μm are connected to one another by a connecting layer. It can be seen from FIG. 14 that the connecting layer 5 is increasingly advantageous given increasing layer thickness. However, it also proceeds from FIG. 14 that a number of individual semiconductor chips, each having an elevation 4, represent the best case, since the output efficiency is highest given the thickness $h_w$=0. Individual chips, however, have the disadvantage that their power cannot be arbitrarily increased, since the dimensions of the semiconductor chips must also be scaled with the power. For practical reasons, however, the thickness of epitaxial layers is limited. This means that individual semiconductor chips cannot be designed for arbitrarily high powers. The semiconductor chips presented in FIGS. 1 through 4, however, can be arbitrarily scaled for this purpose, since only the number of elevations 4 must be increased corresponding to the increasing area of the connecting layer 5 in order to increase the light power of the semiconductor chips.

A further investigation was directed to determine whether the active zone 3 could perhaps be arranged in the connecting layer 5. To this end, the output efficiency for a conventional thin-film light-emitting diode was calculated and this was set equal to 1 for comparison purpose. A semiconductor chip having active zone 3 in the connecting layer 5 has an output efficiency of 1.5 compared to the conventional thin-film light-emitting diode. Finally, a relative output efficiency of 1.67 was derived for the semiconductor chips shown in FIGS. 1 through 4. This shows that an increase in the output efficiency η also can be achieved when the active zone 3 is arranged in the connecting layer 5.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for simultaneous manufacture of a plurality of semiconductor chips for optoelectronics having an active thin-film layer wherein a photon-emitting active zone is formed, comprising the steps of:
   epitaxially growing a layer sequence containing a photon-emitting zone on a growth substrate wafer;
   forming at least one cavity in the layer sequence such that a plurality of mesas are formed in the layer sequence, said mesas being connected by connecting portions including at least a portion of said photon-emitting zone;
   applying at least one insulating layer onto a surface of the layer sequence provided with cavities;
   producing at least one through-contacting on the mesas;
   applying a wafer composite including the growth substrate wafer and the layer sequence onto a carrier substrate wafer such that the mesas face toward the carrier substrate wafer;
   uniting the wafer composite with the carrier substrate wafer;
   at least partially removing the growth substrate wafer;
   applying an electrical contact onto a side of the layer sequence lying opposite the mesas; and
   dividing a wafer composite of the carrier substrate wafer and the structured layer sequence along parting tracks to form semiconductor chips, each of the semiconductor chips including a light emitting diode having a plurality of the mesas.

2. The method as claimed in claim 1, wherein the uniting step includes bonding.

3. The method according to claim 1, further comprising:
   dividing the layer sequence along the parting tracks before connecting the layer sequence to the carrier substrate wafer.

4. The method according to claim 3, further comprising:
   dividing the layer sequence along the parting tracks in a separate step before the connecting step, before removal of the growth substrate wafer and before the parting step of the carrier substrate wafer.

5. A method for simultaneous manufacture of a plurality of semiconductor chips for optoelectronics having an active thin-film layer wherein a photon-emitting active zone is formed, comprising the steps of:
- epitaxially growing a layer sequence containing a photon-emitting active zone on a growth substrate wafer;
- forming at least one cavity in said layer sequence such that a plurality of mesas are formed in said layer sequence, said mesas being connected with each other via a connecting layer of said layer sequence and said photon-emitting active zone being arranged in said connecting layer;
- applying a reflective layer onto a surface of said layer sequence provided with said at least one cavity;
- applying said layer sequence onto a carrier substrate wafer such that said mesas face toward said carrier substrate water;
- at least partially removing said growth substrate wafer from said layer sequence;
- applying an electrical contact onto a side of said layer sequence lying opposite a side of said surface provided with said at least one cavity;
- dividing said carrier substrate wafer and said layer sequence to form semiconductor chips, each of said semiconductor chips including a light emitting diode having a plurality of said mesas.

6. The method as claimed in claim 5, wherein said layer sequence is secured to said carrier member by eutectic bonding.

7. The method as claimed in claim 5, wherein said layer sequence is divided according to an intended number of said semiconductor chips before applying said layer sequence to said carrier substrate.

8. The method as claimed in claim 7, wherein said step of dividing said carrier substrate wafer and said layer sequence includes the sub-steps of:
- dividing said layer sequence; and
- dividing said carrier substrate in a separate step from said step of dividing said layer sequence and after said step of dividing said layer sequence.

9. The method as claimed in claim 8, wherein said growth substrate wafer is at least partially removed before said step of dividing said carrier substrate wafer.

10. The method as claimed in claim 5, wherein said step of applying said reflective layer comprises:
- applying at least one insulating layer onto the surface of said layer sequence,
- producing at least one through-contacting on said mesas, and
- applying a metallization layer onto said at least one insulation layer.

11. A method for simultaneous manufacture of a plurality of semiconductor chips for optoelectronics having an active thin-film layer wherein a photon-emitting active zone is formed, comprising the steps of:
- epitaxially growing a layer sequence containing a photon-emitting active zone on a growth substrate wafer;
- forming at least one cavity in said layer sequence such that a plurality of mesas are formed in said layer sequence;
- forming a reflective layer on a surface of said layer sequence, the surface being provided with said at least one cavity, including:
  - applying at least one insulating layer onto the surface of said layer sequence,
  - producing at least one through-contacting on said mesas, and
  - applying a metallization layer onto said insulation layer;
- applying said layer sequence onto a carrier substrate wafer such that said mesas face toward said carrier substrate wafer;
- at least partially removing said growth substrate wafer from said layer sequence;
- applying an electrical contact onto a side of said layer sequence lying opposite a side of said surface provided with said at least one cavity; and
- dividing said carrier substrate wafer and said layer sequence to form semiconductor chips, each of said semiconductor chips including a light emitting diode having a plurality of said mesas.

12. The method as claimed in claim 11, wherein said layer sequence is secured at said carrier member by eutectic bonding.

13. The method as claimed in claim 11, wherein said layer sequence is divided according to an intended number of said semiconductor chips before applying said layer sequence to said carrier substrate.

14. The method as claimed in claim 13, wherein said step of dividing includes said layer sequence being divided in a divide step before a dividing step of dividing said carrier substrate.

15. The method as claimed in claim 14, wherein said growth substrate wafer is at least partially removed before said dividing step of the carrier substrate wafer.

16. The method as claimed in claim 11, wherein said at least one cavity is formed such that said mesas are connected with each other via a connecting layer of said layer sequence and that said active zone is arranged in said connecting layer.

* * * * *

UNITED STATES PATENT AND TRADEMARK OFFICE
CERTIFICATE OF CORRECTION

PATENT NO. : 6,995,030 B2
APPLICATION NO. : 10/346605
DATED : February 7, 2006
INVENTOR(S) : Stefan Illek et al.

It is certified that error appears in the above-identified patent and that said Letters Patent is hereby corrected as shown below:

Title Page should read:

-- (75) Inventors: Stefan Illek, Feldkirchen (DE); Klaus Streubel, Laaber (DE); Walter Wegleiter, Nittendorf (DE); Andreas Ploessl, Regensburg (DE); Ralph Wirth, Regensburg (DE) --

Col. 10, line 41, replace the expression "substrate wafer" with -- member --

Col. 10, line 42, replace the expression "substrate wafer" with -- member --

Col. 10, lines 43 and 44, replace the expression "substrate wafer" with -- member --

Col. 10, line 48, replace the expression "substrate wafer" with -- member --

Col. 10, line 58, replace the expression "substrate wafer" with -- member --

Col. 10, line 63, replace the expression "substrate wafer" with -- member --

Col. 11, lines 13 and 14, replace the expression "substrate wafer" with -- member --

Col. 11, line 15, replace the expression "substrate water" with -- member --

Col. 11, line 21, replace the expression "substrate wafer" with -- member --

Col. 11, line 31, replace the expression "carrier substrate" with -- carrier member --

Col. 11, line 33, replace the expression "substrate wafer" with -- member --

Col. 11, line 36, replace the expression "carrier substrate" with -- carrier member --

Col. 11, line 41, replace the expression "substrate wafer" with -- member --

Col. 12, lines 19 and 20, replace the expression "substrate wafer" with -- member --

Col- 12, line 21, replace the expression "substrate wafer" with -- member --

Col. 12, line 27, replace the expression "substrate wafer" with -- member --

UNITED STATES PATENT AND TRADEMARK OFFICE
CERTIFICATE OF CORRECTION

PATENT NO. : 6,995,030 B2
APPLICATION NO. : 10/346605
DATED : February 7, 2006
INVENTOR(S) : Stefan Illek et al.

It is certified that error appears in the above-identified patent and that said Letters Patent is hereby corrected as shown below:

Col. 12, line 37, replace the expression "carrier substrate" with -- carrier member --

Col. 12, line 41, replace the expression "substrate" with -- member --

Col. 12, line 44, replace the expression "substrate wafer" with -- member --

Col. 12, after line 48, add claims 17 and 18 as follows:

-- 17. A method for simultaneous manufacture of a plurality of semiconductor chips for optoelectronics having an active thin-film layer wherein a photon-emitting active zone is formed, comprising the steps of:

epitaxially growing a layer sequence containing a photon-emitting zone on a growth substrate wafer;

forming at least one cavity in the layer sequence such that a plurality of mesas are formed in the layer sequence, said mesas being connected by connecting portions including at least a portion of said photon-emitting zone;

applying at least one insulating layer onto a surface of the layer sequence provided with cavities;

producing at least one through-contacting on the mesas;

at least partially removing the growth substrate wafer;

applying an electrical contact onto a side of the layer sequence lying opposite the mesas; and

UNITED STATES PATENT AND TRADEMARK OFFICE
CERTIFICATE OF CORRECTION

PATENT NO.       : 6,995,030 B2
APPLICATION NO.  : 10/346605
DATED            : February 7, 2006
INVENTOR(S)      : Stefan Illek et al.

It is certified that error appears in the above-identified patent and that said Letters Patent is hereby corrected as shown below:

Col. 12, after line 48 (cont'd):

dividing the structured layer sequence to form semiconductor chips, each of the semiconductor chips including a light emitting diode having a plurality of the mesas.

Signed and Sealed this

Third Day of April, 2007

JON W. DUDAS
*Director of the United States Patent and Trademark Office*